(12) United States Patent
Juschkin et al.

(10) Patent No.: US 11,293,880 B2
(45) Date of Patent: Apr. 5, 2022

(54) METHOD AND APPARATUS FOR BEAM STABILIZATION AND REFERENCE CORRECTION FOR EUV INSPECTION

(71) Applicant: KLA Corporation, Milpitas, CA (US)

(72) Inventors: Larissa Juschkin, Pleasanton, CA (US); Konstantin Tsigutkin, Pleasanton, CA (US); Debashis De Munshi, San Jose, CA (US)

(73) Assignee: KLA Corporation, Milpitas, CA (US)

( * ) Notice: Subject to any disclaimer, the term of this patent is extended or adjusted under 35 U.S.C. 154(b) by 0 days.

(21) Appl. No.: 17/110,856

(22) Filed: Dec. 3, 2020

(65) Prior Publication Data

US 2021/0262944 A1 Aug. 26, 2021

Related U.S. Application Data

(60) Provisional application No. 62/978,969, filed on Feb. 20, 2020.

(51) Int. Cl.
*G01N 21/95* (2006.01)
*G01N 21/88* (2006.01)
(Continued)

(52) U.S. Cl.
CPC ..... *G01N 21/9501* (2013.01); *G01N 21/8851* (2013.01); *G06T 5/001* (2013.01);
(Continued)

(58) Field of Classification Search
CPC ............ G01N 21/9501; G01N 21/8851; G06T 5/001; G06T 7/0004
See application file for complete search history.

(56) References Cited

U.S. PATENT DOCUMENTS 8,842,272 B2 9/2014 Wack et al.
9,671,548 B2 6/2017 Wald et al.
(Continued)

FOREIGN PATENT DOCUMENTS

JP 2013108950 A 6/2013
JP 6249513 B1 12/2017

OTHER PUBLICATIONS

Opto Diode Corporation, "Quad Electron Detector 146 mm2", AXUVPS7, https://optodiode.com/pdf/AXUVPS7DS.pdf, Revised Aug. 24, 2020, 4 pages.
(Continued)

*Primary Examiner* — Hugh Maupin
(74) *Attorney, Agent, or Firm* — Suiter Swantz pc llo

(57) ABSTRACT

An inspection system and a method of using the same are disclosed. The inspection system comprises an illumination source configured to emit an extreme ultraviolet (EUV) illumination beam for illuminating a sample, one or more first multi-cell detectors configured to generate a first illumination intensity distribution signal based on a first photocurrent, one or more second multi-cell detectors configured to generate a second illumination intensity distribution signal based on a second photocurrent, a detector assembly configured to receive the illumination beam and generate images, and a controller configured to: receive the images from the detector assembly, calibrate the second illumination intensity distribution signal to the images by mapping distortions in the second illumination intensity distribution signal to distorted pixels in the images, increase or decrease intensities of the distorted pixels in the images to generate corrected images, and detect defects on the samples.

22 Claims, 10 Drawing Sheets

(51) Int. Cl.
*G06T 7/00* (2017.01)
*G06T 5/00* (2006.01)
(52) U.S. Cl.
CPC .... *G06T 7/0004* (2013.01); *G01N 2021/8887* (2013.01); *G01N 2201/127* (2013.01); *G06T 2207/30148* (2013.01)

(56) References Cited

U.S. PATENT DOCUMENTS

| | | |
|---|---|---|
| 2003/0043370 A1 | 3/2003 | Goldberg |
| 2007/0010974 A1 | 1/2007 | Nicoli et al. |
| 2007/0035712 A1* | 2/2007 | Gassner .............. G03F 7/70666 355/55 |
| 2011/0235015 A1 | 9/2011 | Dengel et al. |
| 2016/0147161 A1* | 5/2016 | Nikipelov ............. H01S 3/0903 355/67 |
| 2016/0154301 A1 | 6/2016 | Ekinci |
| 2018/0005364 A1* | 1/2018 | Meeks ............... G06K 9/00134 |
| 2018/0276812 A1 | 9/2018 | Kohyama et al. |
| 2019/0049861 A1* | 2/2019 | Van Voorst ......... G03F 7/70616 |

OTHER PUBLICATIONS

PCT International Search Report and Written Opinion for International Application No. PCT/US2021/017306 dated May 7, 2021, 6 pages.

\* cited by examiner

METHOD AND APPARATUS FOR BEAM STABILIZATION AND REFERENCE CORRECTION FOR EUV INSPECTION

CROSS-REFERENCE TO RELATED APPLICATION

The present application claims the benefit under 35 U.S.C. § 119(e) of U.S. Provisional Application Ser. No. 62/978,969 filed Feb. 20, 2020, entitled METHOD AND APPARATUS FOR BEAM STABILIZATION AND REFERENCE CORRECTION FOR EUV INSPECTION, naming Larissa Juschkin, Konstantin Tsigutkin, and Debashis De Munshi as inventors, which is incorporated herein by reference in the entirety.

TECHNICAL FIELD

The present disclosure generally relates to the detection of defects in photomasks and semiconductor wafers. In particular, the present disclosure relates to measuring illumination distribution at a photomask and to providing feedback for maintaining optical alignment of the source beam.

SUMMARY

An inspection system is disclosed in accordance with one or more illustrative embodiments of the present disclosure. In one illustrative embodiment, the inspection system comprises an illumination source configured to emit an extreme ultraviolet (EUV) illumination beam for illuminating a sample; one or more first multi-cell detectors, wherein each of the first multi-cell detectors comprises at least two segments and is configured to generate a first photocurrent when the illumination beam passes through the one or more first multi-cell detectors, wherein each of the first multi-cell detectors includes an aperture at a center portion thereof, wherein each of the first multi-cell detectors is configured to generate a first illumination intensity distribution signal based on the first photocurrent; one or more second multi-cell detectors, wherein each of the second multi-cell detectors comprises at least two segments and is configured to generate a second photocurrent when the illumination beam passes through the one or more second multi-cell detectors, wherein each of the second multi-cell detectors is configured to generate a second illumination intensity distribution signal based on the second photocurrent; a detector assembly configured to receive the illumination beam from the sample and generate images based on the illumination beam; and a controller communicatively coupled to the detector assembly, the one or more first multi-cell detectors, and the one or more second multi-cell detectors, wherein the controller includes one or more processors configured to execute program instructions causing the one or more processors to: receive the images from the detector assembly, calibrate the second illumination intensity distribution signal to the images by mapping distortions in the second illumination intensity distribution signal to distorted pixels in the images, adjust intensities of the distorted pixels in the images based on the second illumination intensity distribution signal to generate corrected images, and detect defects on the sample using the corrected images.

An inspection method is disclosed in accordance with one or more illustrative embodiments of the present disclosure. The inspection method comprises emitting an extreme ultraviolet (EUV) illumination beam using an illumination source; generating a first photocurrent with one or more first multi-cell detectors when the illumination beam passes through each of the first multi-cell detectors, wherein each of the first multi-cell detectors comprises at least two segments and an aperture at a center portion thereof; generating a first illumination intensity distribution signal based on the first photocurrent; generating a second photocurrent with one or more second multi-cell detectors when the illumination beam passes through each of the second multi-cell detectors, wherein each of the second multi-cell detectors comprises at least two segments; generating a second illumination intensity distribution signal based on the second photocurrent; illuminating a sample with the illumination beam; receiving the illumination beam from the sample with a detector assembly; generating images based on the illumination beam; calibrating the second illumination intensity distribution signal to the images by mapping distortions in the second illumination intensity distribution signal to distorted pixels in the images; adjusting intensities of the distorted pixels in the images based on the second illumination intensity distribution signal to generate corrected images; and detecting defects on the sample using the corrected images.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the disclosure may be better understood by those skilled in the art by reference to the accompanying figures in which.

DETAILED DESCRIPTION OF THE INVENTION

Figure 1:
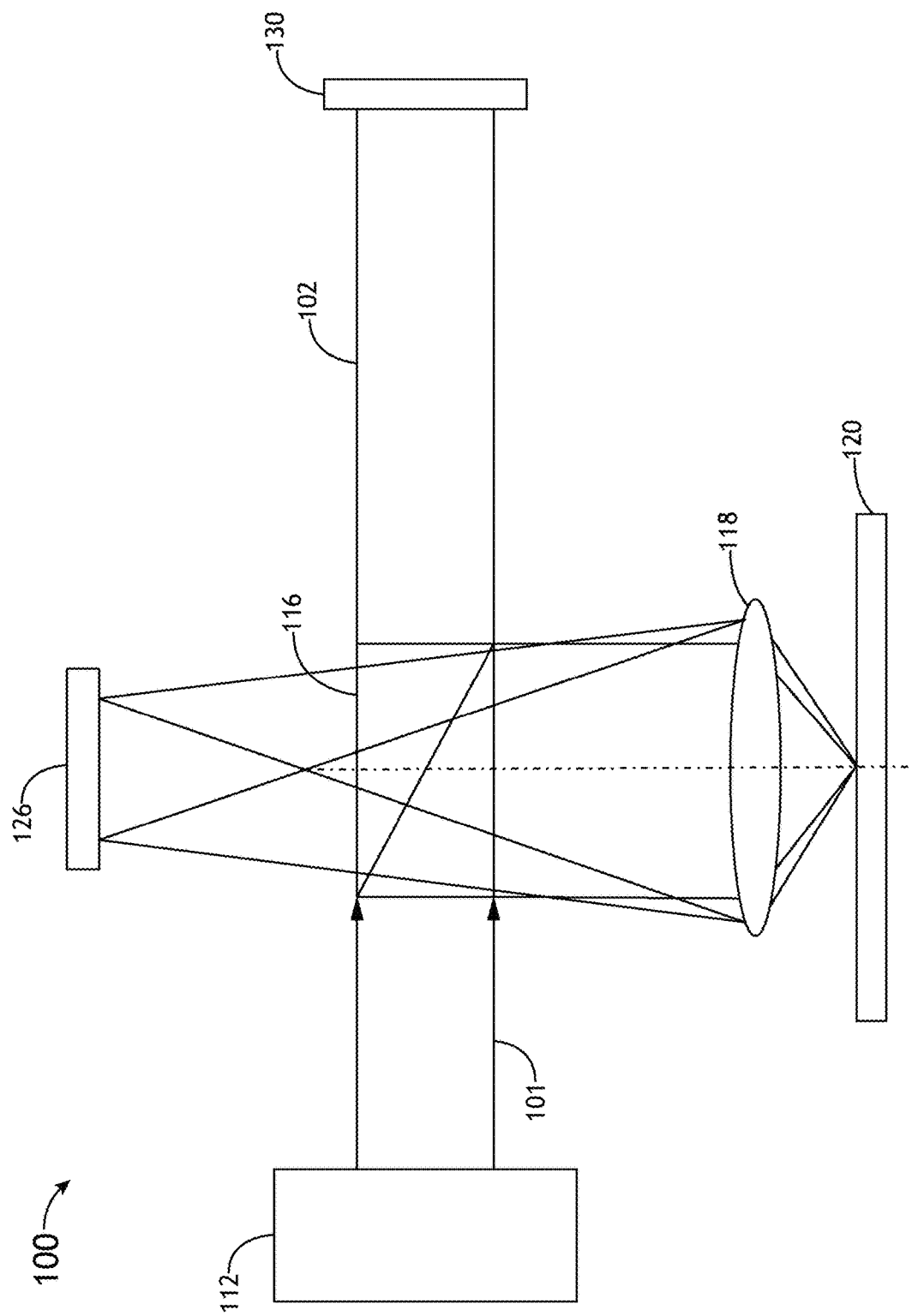
FIG. 1 is a simplified schematic view illustrating a conventional inspection system including a detector for reference beam measurement.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention. It should be readily apparent to those of ordinary skill in the art that various changes and modifications in form and detail may be made without departing from the spirit and scope of the disclosure. Reference will now be made in detail to the subject matter disclosed, which is illustrated in the accompanying drawings.

Embodiments of the present disclosure are directed to an inspection system configured to detect one or more defects on a sample by illuminating the sample with photons and collecting illumination reflected and/or scattered from the sample at one or more detectors to generate image data. The sample may be, for example, a photomask used in extreme ultraviolet (EUV) lithography (e.g., photon wavelengths less than 190 nm). It is desirable to detect as many defects as possible since defects may cause a degradation of quality and performance in the integrated circuits subsequently fabricated using the masks (e.g., by EUV lithography). Additionally, it is desirable to identify the defects as quickly as possible in order to increase the rate of manufacture and maximize yield.

The image data may comprise a plurality of high-resolution images (e.g., test images) where each image corresponds to an area-of-interest on the sample. Each of the test images may be compared to a corresponding reference image. A reference image may be used as an ideal or error-free image such that when the reference image is subtracted from a respective test image, the difference may indicate a problematic structure (i.e., a defect) on the surface of the sample at the area-of-interest and a corrective action may be performed (e.g., by altering the design or processing of the photomask).

To detect defects with a high accuracy, it is desirable to generate test images with high fidelity (i.e., low noise) such that when the reference images are subtracted from the test images, only pixels associated with actual defects (i.e., real defects) are identified and noise is not mistakenly identified as a defect. To remove the noise associated with variations of illumination, the test image may be corrected based on the illumination intensity distribution at the plane of the sample. For areas of the sample that are too dark in the test image, the intensity scale (grayscale) of the dark pixels may be increased, and vice versa. This process of adjusting the grayscale to remove noise in the test images caused by uneven and/or temporally varying illumination distribution at the sample is also known as reference correction.

To accurately identify the defects, the inspection system may operate at the same wavelength that is used in the lithographic process (e.g., the EUV spectral range). The EUV spectral range presents many challenges due to short wavelengths, energetic photons, low radiance (i.e., brightness) of EUV radiation sources, and absence of refractive (i.e., transmissive) optics. The knowledge of EUV illumination distribution and stability at the sample is essential for pattern analysis. To this end, systems of the present disclosure may be configured to (1) measure the illumination distribution at the sample, (2) provide feedback for maintaining a stable alignment of the illumination beam, and (3) correct distorted pixels (e.g., reference correction) in the test images based on the illumination intensity distribution measurement. The illumination intensity distribution measurement, beam stabilization and reference correction may be performed in real-time to ensure the time-variation of the illuminating light is within system requirements.

FIG. 1 is a simplified schematic view illustrating a conventional inspection system 100 including a beam monitor 130 for reference correction. As shown, the conventional inspection system 100 includes an illumination source 112 that generates a beam 101, an objective lens 118 that directs illumination to a sample 120, and a detector 126 that collects illumination reflected or scattered off the sample 120. A beam splitter 116 splits the beam 101 and the monitor 130 collects a beam 102 (e.g., monitoring signal) split from the beam 101. This monitoring signal is used for reference correction by measuring the dose of illumination over the projected pixel area on the sample 120 during each exposure and providing correction factors for each pixel in the detector 126 based on the measurement.

Although straightforward to implement, the configuration of the conventional inspection system 100 is unfeasible when operating in the EUV spectral range since beam splitters are not efficient at these wavelengths. Additionally, placing pick-up optics in the illumination beam path for beam stabilization introduces distortions and uncertainties of illumination profile at the target, and reduces overall photon flux available for the inspection. Furthermore, when the power source is spatially integrated, it is difficult to measure changes in the spatial distribution of illumination intensity since monitoring only the source power is not sufficient when the source is inherently unstable and jittering. In contrast, embodiments of the present disclosure circumvent the problems inherent in measuring the distribution of EUV radiation for beam stabilization and reference correction. Thus, embodiments of the present disclosure may improve the fidelity and homogeneity of test images without an equivalent increase in cost or complexity of the optics or the radiation source.

Figure 2:
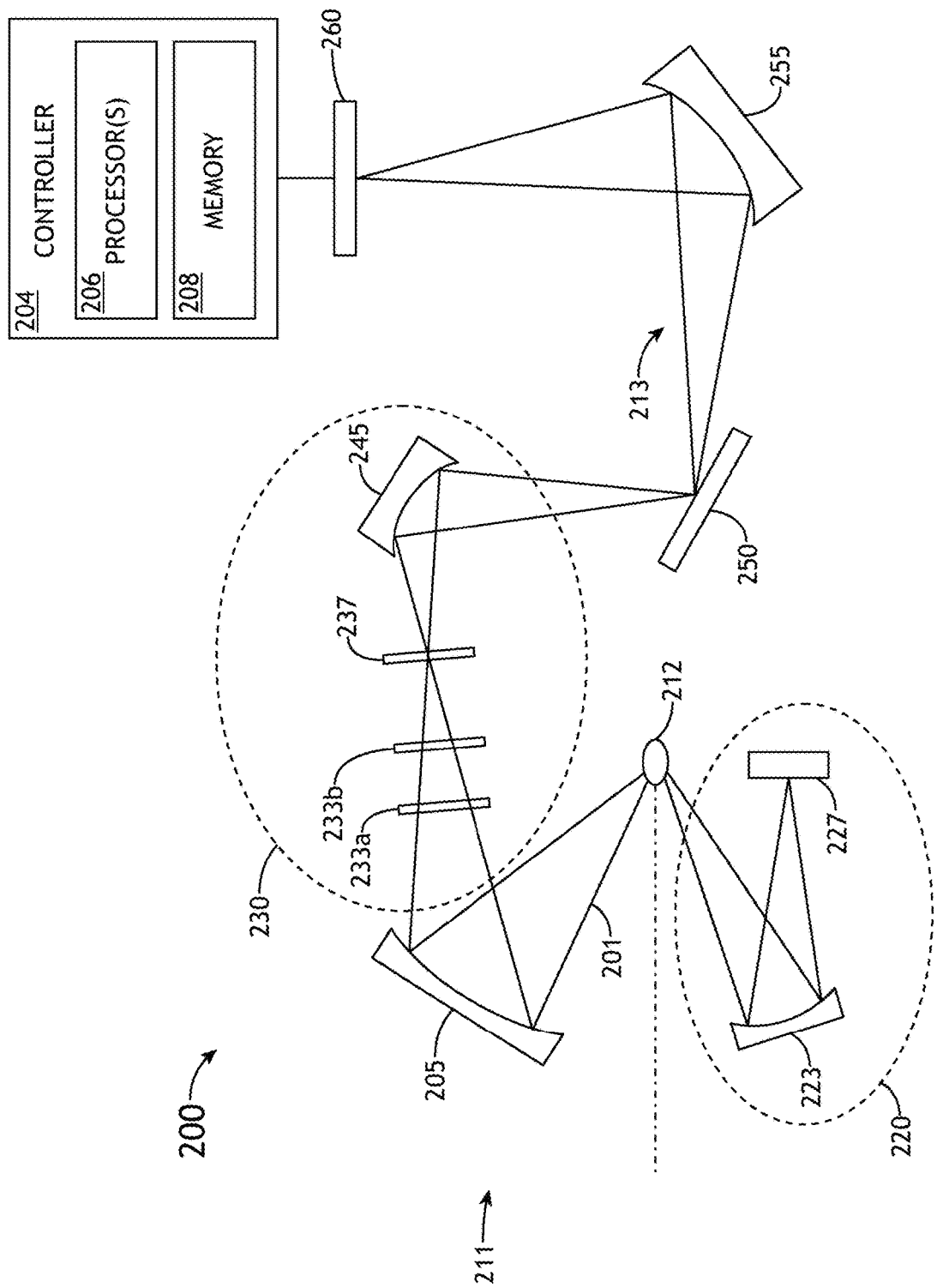
FIG. 2 is a simplified schematic view illustrating an inspection system, in accordance with one or more embodiments of the present disclosure.

FIG. 2 is a simplified schematic view of an inspection system 200 for determining defects on a surface of a sample 250 (e.g., a photomask, semiconductor wafer, etc.), in accordance with one or more embodiments of the present disclosure. The inspection system 200 may include, but is not limited to, an illumination source 212, an illumination arm 211, a collection arm 213, and a detector assembly 260. The inspection system 200 may employ any optical-based inspection techniques known in the art. In some embodiments, the inspection system 200 may be a broadband inspection system (e.g., broadband plasma source-based inspection system) or a narrowband inspection system (e.g., laser-based inspection system). In some embodiments, the inspection system 200 may include an optical dark-field inspection tool.

In one embodiment, a controller 204 is communicatively coupled to the detector assembly 260. The controller 204 may include one or more processors 206 and a memory 208. The memory 208 may include program instructions configured to cause the one or more processors 206 to perform various functions, procedures, algorithms, steps, etc., of the present disclosure. The controller 204 may be configured to determine one or more features of the sample 250 indicative of one or more defects of the sample 250. In another embodiment, the controller 204 may be configured to receive one or more target images of one or more target features of a target sample. In some embodiments, the controller 204 may be configured to receive one or more images where each of the images corresponds to an area-of-interest on the sample 250. Each of the images may be test images to be subsequently inspected for defects and may be associated with one or more reference images to be compared.

In some embodiments, the illumination source 212 may include any illumination source known in the art for generating an illumination beam 201 including, but not limited to, a broadband radiation source. In some embodiments, the beam 201 may comprise extreme ultraviolet (EUV) light or vacuum ultraviolet (VUV) light. When using VUV or EUV light, the system 200 may operate in a vacuum to prevent the atmosphere from absorbing the light beam 201. In some embodiments, the beam 201 may comprise soft x-rays having one or more wavelengths of about 1 nm to about 5 nm. In some embodiments, the beam 201 may comprise EUV light having a wavelength of about 13.5 nm, one or more wavelengths of about 10 nm to about 124 nm, or one or more wavelengths of about 5 nm to about 30 nm. In some embodiments, the beam 201 may comprise VUV light having one or more wavelengths less than 190 nm to about 5 nm.

The illumination source 212 may include any suitable light source known in the art capable of emitting the beam 201 at one or more of these wavelengths. Such light sources include, but are not limited to, laser-induced plasma sources, discharge-induced plasma sources, cathode/anode type sources, synchrotron sources, etc. In addition, the embodiments described herein may be used with any light source (e.g., plasma-based) emitting light into a relatively broad angular range. In some embodiments, the system 200 may be configured using critical illumination where an image of the illumination source 212 is projected on the sample 250 for bright illumination. In some embodiments, the system 200 may be configured using köhler illumination or homogenizer-based illumination which provides more even or homogenous illumination of the sample 250.

In some embodiments, the illumination arm 211 is configured to direct the beam 201 to the sample 250. The illumination arm 211 may include any number and type of optical components known in the art. In some embodiments, the illumination arm 211 may include one or more optical elements. The one or more optical elements may include any optical elements known in the art including, but not limited to, one or more mirrors, one or more lenses, one or more polarizers, one or more beam splitters, one or more wave plates, one or more apodizers, and the like. In this regard, illumination arm 211 may be configured to focus the beam 201 from the illumination source 212 onto the surface of the sample 250. For example, a collector mirror 205 may be configured to direct the beam 201 to an illuminator mirror 245. The illuminator mirror 245 may then be configured to direct the beam 201 to the sample 250.

The sample 250 may include any sample known in the art including, but not limited to a photomask, a reticle, a wafer, etc. In one embodiment, the sample 250 is disposed on a stage assembly to facilitate movement of the sample 250. In another embodiment, the stage assembly is an actuatable stage. For example, the stage assembly may include, but is not limited to, one or more translational stages suitable for selectably translating the sample 250 along one or more linear directions (e.g., x-direction, y-direction and/or z-direction). By way of another example, the stage assembly may include, but is not limited to, one or more rotational stages suitable for selectively rotating the sample 250 along a rotational direction. By way of another example, the stage assembly 250 may include, but is not limited to, a rotational stage and a translational stage suitable for selectably translating the sample 250 along a linear direction and/or rotating the sample 250 along a rotational direction.

In some embodiments, the collection arm 213 is configured to collect illumination reflected or scattered from sample 250. In another embodiment, the collection arm 213 may direct and/or focus the reflected and scattered light to one or more sensors (e.g., detectors) of a detector assembly 260 via one or more optical elements. The one or more optical elements may include any optical elements known in the art including, but not limited to, one or more mirrors, one or more lenses, one or more polarizers, one or more beam splitters, wave plates, and the like. For example, an imaging mirror 255 may direct the light reflected and scattered from the sample 250 to the detector assembly 260. It is noted that illumination arm 211 and collection arm 213 may be configured in any mode known in the art including, but not limited to, a dark-field mode, a bright-field mode, etc. For example, one or more optical elements may be selectably adjusted in order to configure the inspection system 200 in a dark-field mode, a bright-field mode, etc.

The detector assembly 260 may include any sensor and detector assembly known in the art for detecting illumination reflected or scattered from the sample 250. For example, the detector assembly 260 may include a charge-coupled device (CCD) or a time-delay integration (TDI) detector. In some embodiments, the detector assembly 260 is configured to collect inspection data of the sample 250 based on illumination reflected or scattered from the sample 250. In another embodiment, the detector assembly 260 is configured to transmit collected images (e.g., test images to be tested for defects) to the controller 204.

It is noted herein that the one or more components of system 200 may be communicatively coupled to the various other components of system 200 in any manner known in the art. For example, the one or more processors 206 may be communicatively coupled to each other and other components via a wireline (e.g., copper wire, fiber optic cable, and the like) or wireless connection (e.g., RF coupling, IR coupling, WiMax, Bluetooth, 3G, 4G, 4G LTE, 5G, and the like). By way of another example, the controller 204 may be communicatively coupled to one or more components of the inspection sub-system 200 via any wireline or wireless connection known in the art.

In some embodiments, the one or more processors 206 may include any one or more processing elements known in the art. In this sense, the one or more processors 206 may include any microprocessor-type device configured to execute algorithms and/or instructions. In some embodiments, the one or more processors 206 may be a component of a desktop computer, mainframe computer system, workstation, image computer, parallel processor, or other computer system (e.g., networked computer) configured to execute a program configured to operate the system 200, as described throughout the present disclosure. It should be recognized that the steps described throughout the present disclosure may be carried out by a single computer system or, alternatively, multiple computer systems (for example, in a cloud-computing system). Furthermore, it should be recognized that the steps described throughout the present disclosure may be carried out on any one or more of the one or more processors 206. In general, the term "processor" may be broadly defined to encompass any device having one or more processing elements, which execute program instructions from memory 208. Moreover, different components of the system 200 (e.g., illumination source 212, detector assembly 260, controller 204, etc.) may include processor or logic elements suitable for carrying out at least a portion of the steps described throughout the present disclosure. Therefore, the above description should not be interpreted as a limitation on the present disclosure but merely an illustration.

The memory 208 may include any storage medium known in the art suitable for storing program instructions executable by the one or more processors 206 and the data received from the detector assembly 260. For example, the memory 208 may include a non-transitory memory medium. For instance, the memory 208 may include, but is not limited to, a read-only memory (ROM), a random-access memory (RAM), a magnetic or optical memory device (e.g., disk), a magnetic tape, a solid-state drive, and the like. It is further noted that the memory 208 may be housed in a common controller housing with the one or more processors 206, respectively. In an alternative embodiment, the memory 208 may be located remotely with respect to the physical location of the processor 206 and the controller 204.

In one embodiment, a user interface is communicatively coupled to the controller 204. In one embodiment, the user interface may include, but is not limited to, one or more desktops, tablets, smartphones, smart watches, or the like. In another embodiment, the user interface includes a display used to display data of the system 200 to a user. The display of the user interface may include any display known in the art. For example, the display may include, but is not limited to, a liquid crystal display (LCD), an organic light-emitting diode (OLED) based display, or a CRT display. Those skilled in the art should recognize that any display device capable of integration with a user interface is suitable for implementation in the present disclosure. In another embodiment, a user may input selections and/or instructions responsive to data displayed to the user via a user input device (e.g., a mouse and keyboard) of the user interface.

In some embodiments, the inspection system 200 may include a side monitor sub-system 220 configured to measure the illumination intensity distribution and provide reference correction. The side monitor sub-system 220 may include a side detector 227 configured to collect a part of the illumination light 201 generated by the source. In some embodiments, the side monitor sub-system 220 includes an imaging element (e.g., a mirror) 223 configured to direct the part of the illumination light 201 to the side detector 227. The side detector 227 may be, for example, a charge-coupled device (CCD), a complementary metal-oxide-semiconductor (CMOS) sensor, an active pixel sensor (APS), a time-delay integration (TDI) sensor, etc. The side detector 227 may indirectly measure the illumination intensity distribution at the sample 250 by directly imaging the part of the illumination light 201 from the source 212 in real-time (e.g., exposure-to-exposure, or in a scanning TDI mode). In some embodiments, the side detector 227 may collect the part of the beam 201 from a first angle outside the illumination path 211. The first angle of the path of the side detector 227 may be mutually exclusive with the second angle of the illumination path 211. It is noted herein that the part of the illumination light 201 that is collected by the side monitor sub-system 220 may not be used for the illumination of the sample, but rather for monitoring purposes.

A two-dimensional (2D) image of the source 212 collected by the side detector 227 may be used to reconstruct a three-dimensional (3D) spatial distribution of the illumination beam 201 (and its variations) emitted by the source 212. The 3D spatial distribution may be generated by employing tomographic techniques and system symmetries. The 3D geometry of the beam 201 may then be propagated (e.g., by simulation) through an optical model of the inspection system 200 to predict the illumination profile at the sample 250. This direct mapping of the image collected by the side detector 227 to the illumination field of the sample 250 may be used to compensate for variations induced by the source 212 (for example, by increasing or decreasing the intensity scale of pixels in the images collected by the detector assembly 260). In some embodiments, the 2D image collected by the side detector 227 may be calibrated to a separate image (e.g., another measurement of the illumination intensity distribution at another location in the illumination path 211 of the beam 201). Any distortion (e.g., inhomogeneity of illumination intensity) at the plane of the sample 250 may be calibrated (e.g., correlated or associated) with distortions in the 2D image collected by the side detector 227. Additionally, in some embodiments, the 2D image may be used for monitoring and controlling conditions of the source 212 (e.g., size, position, brightness). In this way, the side monitor sub-system 220 may be used for both reference correction and control of the illumination source 212.

In some embodiments, the inspection system 200 may include an inline detector sub-system 230 configured to (i) provide feedback for stabilization of the beam 201, and/or (ii) provide in-line reference correction (e.g., adjust the intensity of distorted pixels in the test images collected by the detector assembly 260). The inline detector sub-system 230 may include one or more detectors 233a-b for beam stabilization and a detector 237 for reference correction. It is noted that reference correction measurement may be performed by the side monitor sub-system 220, the inline detector sub-system 230, or both of the sub-systems.

In some embodiments, the detector 233a may be at a first position in the path of the beam 201, the detector 233b may be at a second position in the path of the beam 201, and the detector 237 may be at a third position in the path of the beam 201. In general, a plurality of detectors 233a-b and 237 may be at a plurality of positions in the path of the beam 201 (e.g., three detectors at three positions, five detectors at five positions, etc.), and the present disclosure is not limited to any particular number of detectors 233a-b and 237. Each detector 233a-b and 237 may receive light in the periphery of the beam 201 and may measure a cross-section of the beam 201 at the respective position in the path of the beam 201.

In some embodiments, each of the detectors 233a-b and 237 may be a multi-cell detector comprising two or more segments (e.g., cells or quadrants). It is noted that the present disclosure is not limited to only two segments, and that the multi-cell detector may comprise more than two segments (e.g., four, six, eight, etc.). The multi-cell detectors 233a-b and 237 may be configured to generate a photocurrent when EUV photons of the beam 201 impinge the detectors 233a-b and 237 positioned at the periphery of the illumination beam (e.g., pass adjacent to the segments). In some embodiments, at least one of the detectors 233a-b and 237 may have an aperture to allow photons to pass (e.g., through the detector's respective center). In some embodiments, the detector 237 may be at an intermediate field plane (e.g., after a homogenizer) outside of the region projected to the detector assembly 260 (e.g., TDI sensors). The detector 237 may measure the illumination intensity distribution for reference correction (e.g., in addition to the monitor sub-system 220). In some embodiments, the detectors 233a-b may be placed before the detector 237 in the path of the beam 201 (e.g., before a homogenizer) and may collect signals for optics stabilization.

Figure 3A:
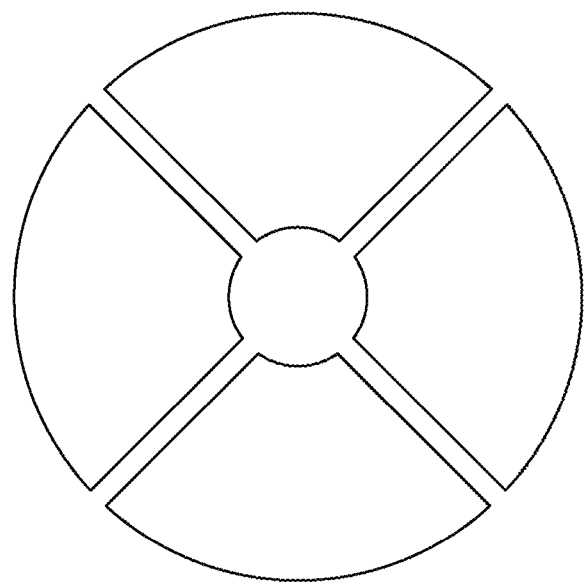
FIGS. 3A-3B are simplified schematic views of detectors for beam stabilization and reference correction, in accordance with one or more embodiments of the present disclosure.
Figure 3B:
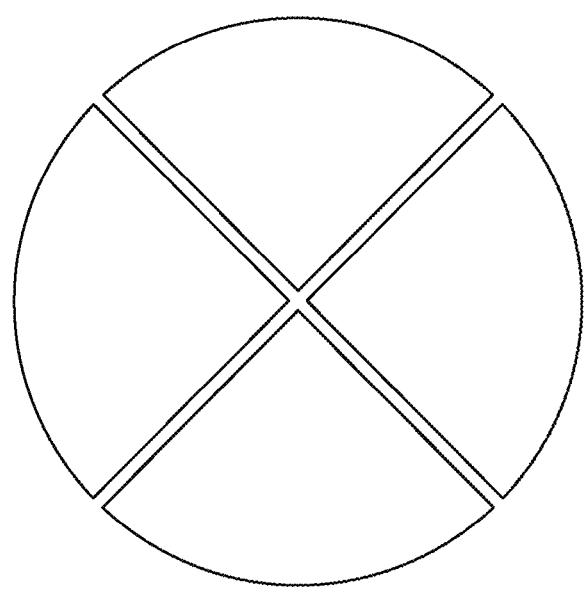

FIGS. 3A-3B are simplified schematic views respectively illustrating a hollow multi-cell detector 300a and a transmissive multi-cell detector 300b, which may be used as the multi-cell detectors 233a-b and 237 in inspection system 200, in accordance with one or more embodiments of the present disclosure. It is noted that one or more of the detectors 233a-b and 237 may be either a hollow multi-cell detector 300a or a transmissive (e.g. thin-film) multi-cell detector 300b. In one example, the detectors 233a-b are hollow multi-cell detectors (e.g., with apertures at their respective centers) and the detector 237 is a transmissive multi-cell detector (e.g., thin-film with no aperture at its center). A detector solution available on the market is the AXUVPS7 from Opto Diode Corporation (Camarillo, Calif.).

The hollow multi-cell detector 300a may be configured to detect the intensity of the light beam 201 in multiple segments (e.g., four cells or quadrants). The aperture at the center of the multi-cell detector 300a may be configured to allow the light beam 201 to pass (e.g., through the detector 300a to reach other detectors). The detector 300a may generate a photocurrent when the EUV light beam 201 passes through the periphery (e.g., the four segments) of the detector 300a. This configuration of the detector 300a enables the measurement of power in the periphery of the beam 201 without excessively reducing the power of the light beam 201. The transmissive multi-cell detector 300b may be configured to generate a photocurrent when EUV light passes through the periphery of the detector 300b. In some embodiments, the detectors 300a-b may operate as a spectral purity filter. By segmenting the filter into multiple components, the spatial illumination intensity distribution of the beam 201 passing through the detectors 300a-b may be measured for multiple purposes (e.g., for both reference correction as well as beam stabilization).

For reference correction, the illumination intensity distribution of the light beam 201 may be calibrated (e.g., mapped) to the pixels of the images collected by the detector assembly 260. Inhomogeneous areas (e.g., areas with either too high intensity or too low intensity) in the light intensity distribution measured by the detector 237 may be targeted for correction, and the corresponding pixels in the images detected by the detector 260 may be adjusted accordingly (e.g., by increasing or decreasing the intensity scale of corresponding pixels). For beam stabilization, the offset of the image of the beam 201 (e.g., from a center point) may be measured over time by the detectors 233a-b. This offset may then be used for a corrective action (e.g., adjusting the position of the source 212 to recenter and stabilize the beam, or adjusting the position of optics such as the mirrors 205 and 245).

In some embodiments, the multi-cell detectors 233a-b may have an input power of about $3*10^{-4}$ W, a source frequency of about 5000 Hz, an energy per pulse of about $6*10^{-5}$ mJ, detected photons per pulse of about $4*10^9$ ph/pulse, detected electrons per pulse of about $9*10^{10}$ e/pulse, a detected charge of about 15 nAs, and a detected charge per section of about 3.7 nAs. It is noted that the present invention is not limited to the parameters described herein, and that other parameters may be possible (e.g., predefined by a user or adjusted in real-time).

FIGS. 4-9 are images showing light intensity distribution measured (e.g., collected) by the detectors 233a-b and 237, in accordance with one or more embodiments of the present disclosure.

Figure 4:
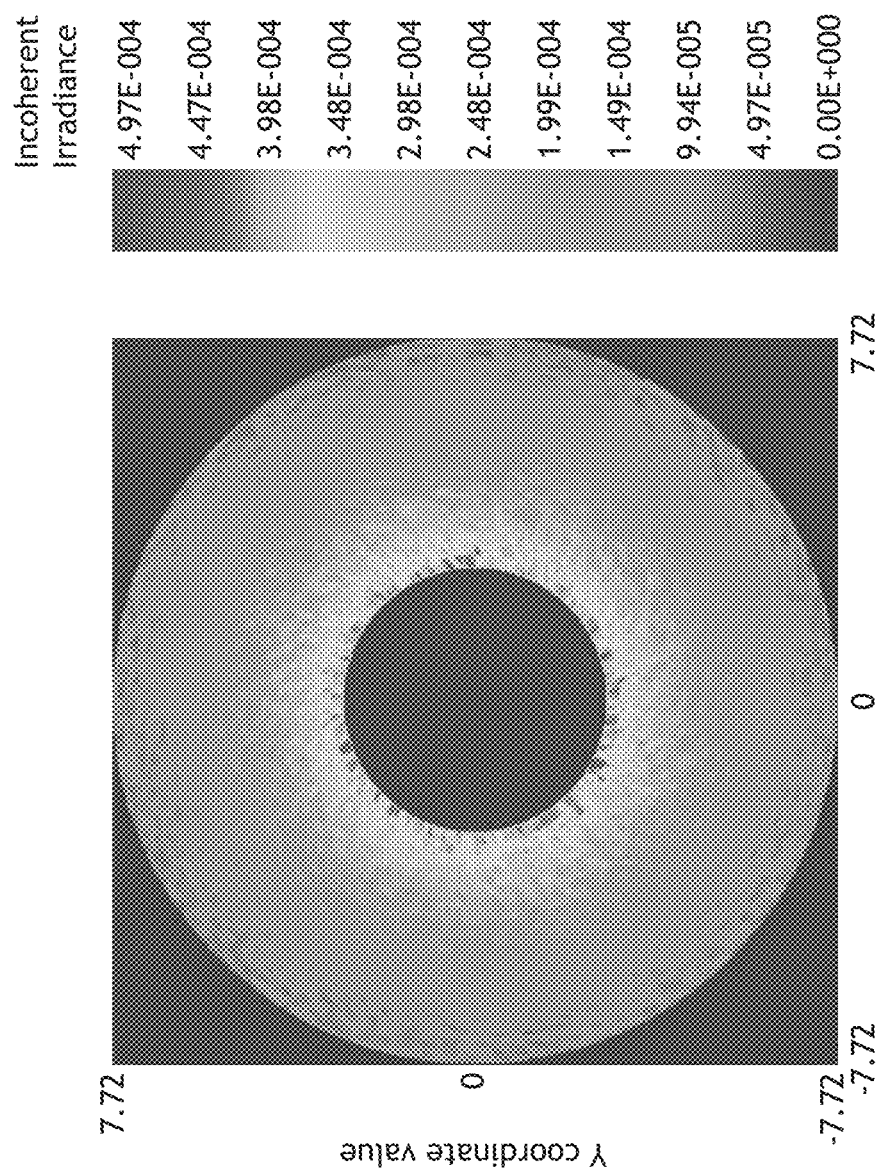
FIGS. 4-6 are images showing light intensity distribution measurements collected for beam stabilization, in accordance with one or more embodiments of the present disclosure.
Figure 5:
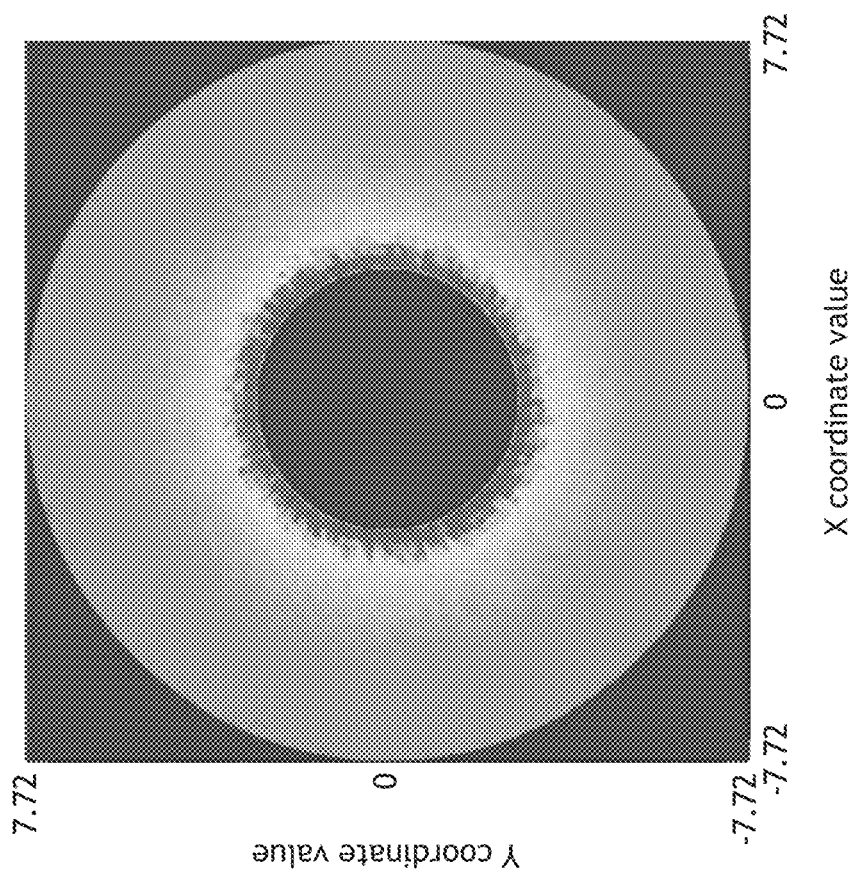
Figure 6:
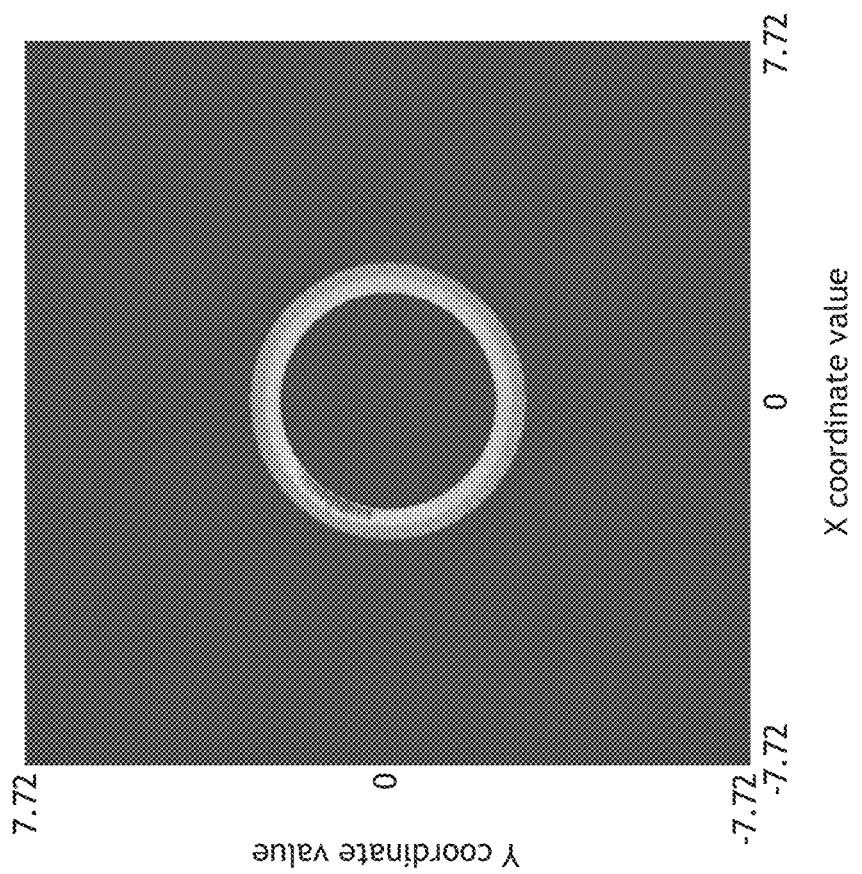

FIGS. 4-5 show measurements of the light intensity distribution at the multi-cell detector 233a for beam stabilization. FIG. 6 shows a measurement of the light intensity distribution at the multi-cell detector 233b for beam stabilization. As shown, the illumination intensity is only measured at the periphery of the detectors 233a-b, and the apertures at the centers of the multi-cell detectors 233a-b let the beam 201 pass without excessively reducing the power of the beam 201.

Figure 7:
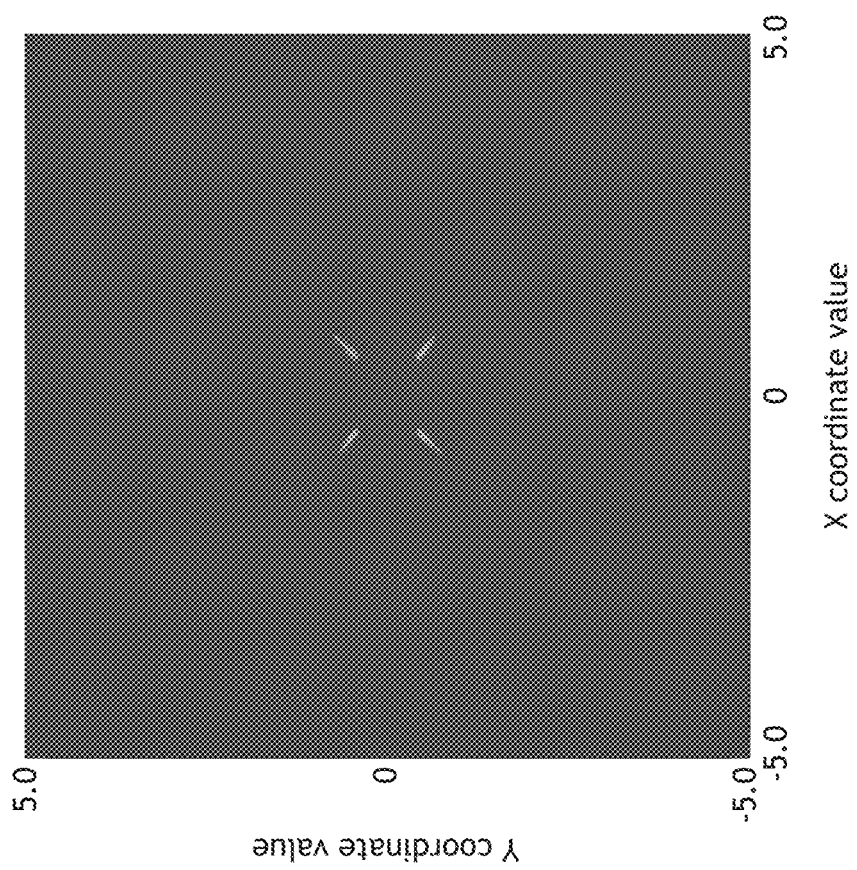
FIG. 7 is an image showing a light intensity distribution measurement collected for reference correction, in accordance with one or more embodiments of the present disclosure.
Figure 8:
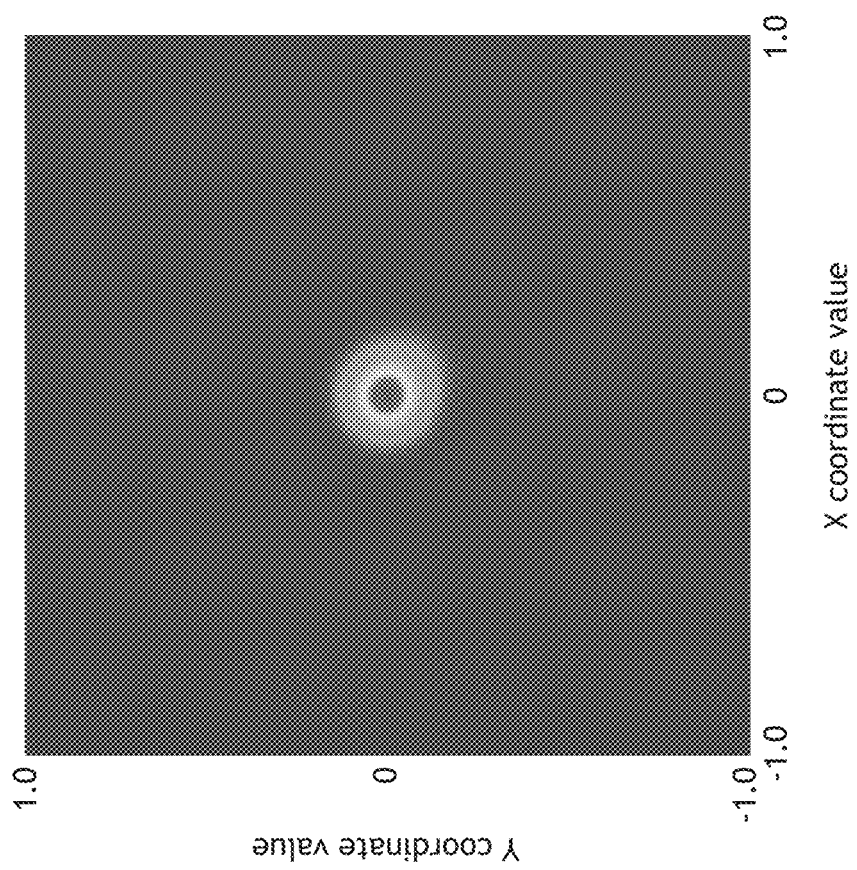
FIGS. 8-9 are images showing light intensity distribution measurements collected by a side monitor for reference correction and illumination source control, in accordance with one or more embodiments of the present disclosure.
Figure 9:
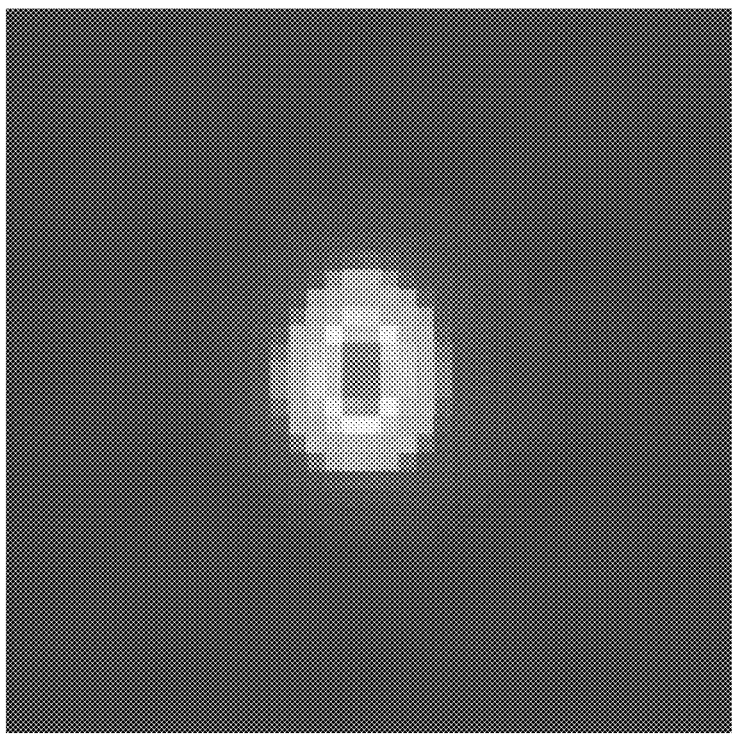

FIG. 7 shows a measurement of the light intensity distribution at the multi-cell detector 237. FIGS. 8-9 show direct measurements of the intensity distribution of the source 212 by the side detector 227 of the side monitor sub-system 220. The measurements collected by the multi-cell detector 237 and the side detector 227 may be used for reference correction (e.g., by mapping distortions in the measurements to distorted pixels in the test images collected by the detector assembly 260).

Figure 10:
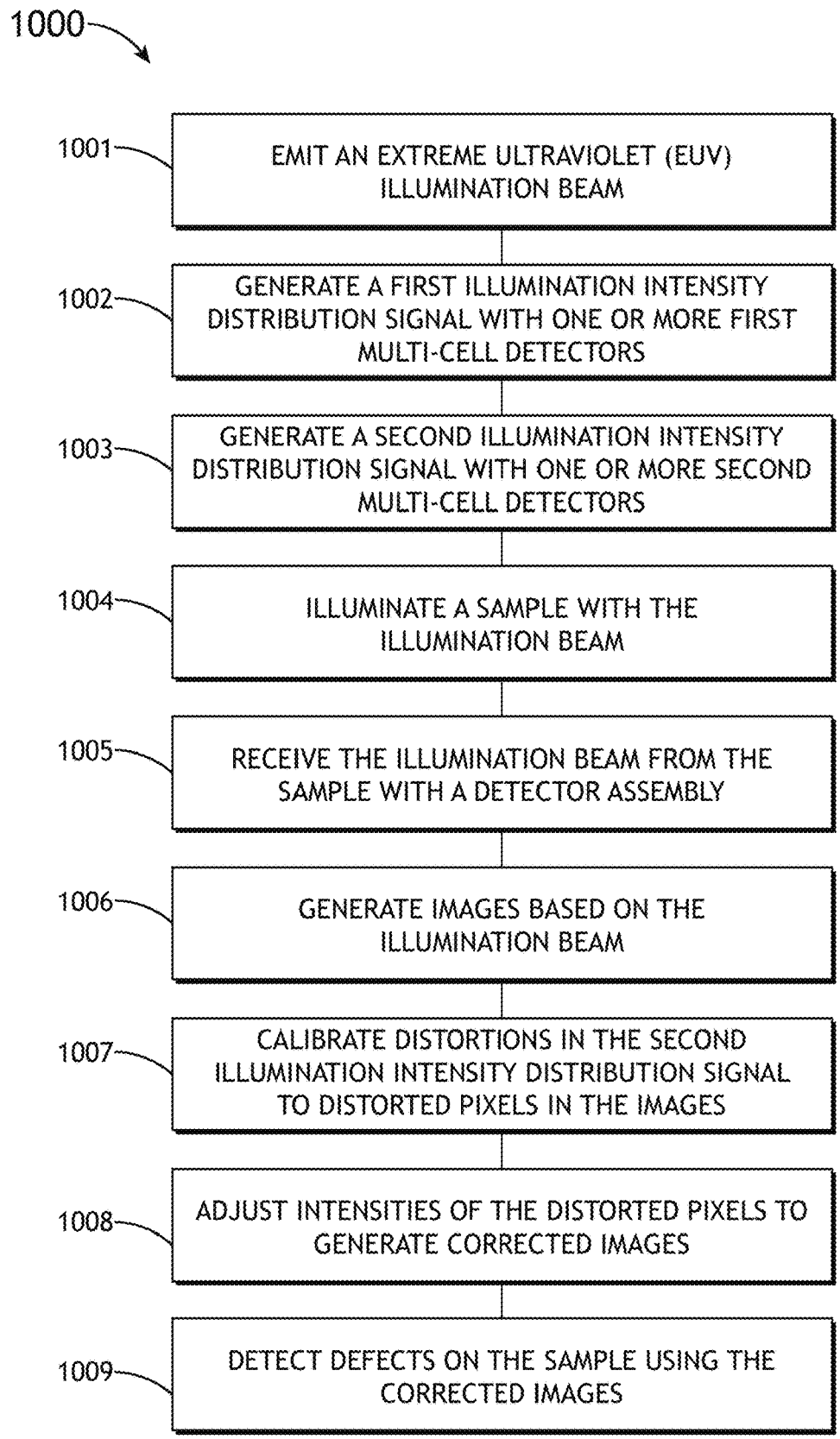
FIG. 10 is a flowchart illustrating an inspection method for reference correction and beam stabilization, in accordance with one or more embodiments of the present invention.

FIG. 10 is a flowchart illustrating an inspection method 1000 for reference correction and beam stabilization, in accordance with one or more embodiments of the present disclosure.

In step 1001, an extreme ultraviolet (EUV) illumination beam (e.g., beam 201) may be emitted by an illumination source (e.g., source 212). The beam may have a wavelength of less than 190 nm. The illumination source may include any suitable light source known in the art capable of emitting the beam at a wavelength of less than 190 nm. Such light sources include, but are not limited to, laser-induced plasma sources, discharge-induced plasma sources, cathode/anode type sources, synchrotron sources, etc. In addition, the embodiments described herein may be used with any light source (e.g., plasma-based) emitting light into a relatively broad angular range.

In step 1002, the beam may pass through first multi-cell detectors (e.g., detectors 233a-b) to generate a photocurrent. The first multi-cell detectors may include apertures at their center portions to allow the beam to pass. A first illumination intensity distribution signal may be generated based on the photocurrent. The first illumination intensity distribution signal may be used for beam stabilization. For example, the offset of the first illumination intensity distribution signal (e.g., from a center point) may be measured over time by the first multi-cell detectors. This offset may then be used for a corrective action (e.g., adjusting the position of the source 212 to recenter and stabilize the beam 201).

In step 1003, the beam may pass through second multi-cell detectors (e.g., detector 237) to generate a photocurrent. A second illumination intensity distribution signal may be generated based on the photocurrent. The second illumination intensity distribution signal may be used for reference correction. For example, distortions (e.g., inhomogeneous areas that are too bright or too dark) in the second illumination intensity distribution signal may be mapped to distorted pixels in the test images collected by the detector assembly (e.g., detector assembly 260).

In step 1004, a sample (e.g., sample 250) may be illuminated by the illumination beam. The sample may be a photomask (i.e., reticle) or a semiconductor wafer. The beam may be scattered and/or reflected from the sample. In step 1005, the beam may be received by the detector assembly. In step 1006, the detector assembly may generate images based on the collected illumination.

In step 1007, distortions in the second illumination intensity distribution signal may be mapped to distorted pixels in the images. In step 1008, intensity scales of the distorted pixels may be adjusted to generate corrected images (e.g., homogenous images without distortions or noise). In step 1009, the corrected images are used to detect defects on the sample (e.g., by subtracting reference images from the corrected images and applying defect-detection algorithms).

Embodiments of the present disclosure are advantageous in several ways. The monitoring of the brightness distribution of the source 212 as a 2D image (e.g., using the side monitor sub-system 220) in addition to the monitoring of the brightness distribution at a position in-line to the beam 201 (e.g., using the multi-cell detector 237) enables correction for variations of the illumination profile in the temporal and spatial domain. Since the measurement for this correction is taken multiple times, each measurement reinforces the other (e.g., since both the monitor sub-system 220 and the multi-cell detector 237 are calibrated to the distortions at the field plane of the sample 250).

Additionally, the feedback for beam stabilization significantly improves image fidelity when using unstable and jittering illumination sources. The beam stabilization may be achieved by direct measurement of the EUV beam path geometry in real time. Furthermore, multiple optical diagnostic measurements may be obtained using the excess angular space in the path of the beam 201. The usage of the main beam 201 is reduced and thus the photon count on the TDI sensors of the detector assembly 260 is not impacted. Additionally, peripheral monitoring avoids any interaction with the main beam 201 and thus prevents the introduction of undesirable aberrations.

All of the methods described herein may include storing results of one or more steps of the method embodiments in memory. The results may include any of the results described herein and may be stored in any manner known in the art. The memory may include any memory described herein or any other suitable storage medium known in the art. After the results have been stored, the results can be accessed in the memory and used by any of the method or system embodiments described herein, formatted for display to a user, used by another software module, method, or system, and the like. Furthermore, the results may be stored "permanently," "semi-permanently," temporarily," or for some period of time. For example, the memory may be random access memory (RAM), and the results may not necessarily persist indefinitely in the memory.

One skilled in the art will recognize that the herein described components operations, devices, objects, and the discussion accompanying them are used as examples for the sake of conceptual clarity and that various configuration modifications are contemplated. Consequently, as used herein, the specific exemplars set forth and the accompanying discussion are intended to be representative of their more general classes. In general, use of any specific exemplar is intended to be representative of its class, and the non-inclusion of specific components, operations, devices, and objects should not be taken as limiting.

With respect to the use of substantially any plural and/or singular terms herein, those having skill in the art can translate from the plural to the singular and/or from the singular to the plural as is appropriate to the context and/or application. The various singular/plural permutations are not expressly set forth herein for sake of clarity.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected," or "coupled," to each other to achieve the desired functionality, and any two components capable of being so associated can also be viewed as being "couplable," to each other to achieve the desired functionality. Specific examples of couplable include but are not limited to physically mateable and/or physically interacting components and/or wirelessly interactable and/or wirelessly interacting components and/or logically interacting and/or logically interactable components.

Furthermore, it is to be understood that the invention is defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," and the like). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, and the like" is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, and the like). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. An inspection system, comprising:
   an illumination source configured to emit an extreme ultraviolet (EUV) illumination beam for illuminating a sample;
   one or more first multi-cell detectors,
   wherein each of the first multi-cell detectors comprises at least two segments and is configured to generate a first photocurrent when the illumination beam passes through the one or more first multi-cell detectors,
   wherein each of the first multi-cell detectors includes an aperture at a center portion thereof,
   wherein each of the first multi-cell detectors is configured to generate a first illumination intensity distribution signal based on the first photocurrent;
   one or more second multi-cell detectors,
   wherein each of the second multi-cell detectors comprises at least two segments and is configured to generate a second photocurrent when the illumination beam passes through the one or more second multi-cell detectors,
   wherein each of the second multi-cell detectors is configured to generate a second illumination intensity distribution signal based on the second photocurrent;
   a detector assembly configured to receive the illumination beam from the sample and generate images based on the illumination beam; and
   a controller communicatively coupled to the detector assembly, the one or more first multi-cell detectors, and the one or more second multi-cell detectors, wherein the controller includes one or more processors configured to execute program instructions causing the one or more processors to:
      receive the images from the detector assembly,
      calibrate the second illumination intensity distribution signal generated by the second multi-cell detectors to the images generated by the detector assembly by mapping distortions in the second illumination intensity distribution signal to distorted pixels in the images,
      adjust intensities of the distorted pixels in the images based on the second illumination intensity distribution signal to generate corrected images, and
      detect defects on the sample using the corrected images.

2. The inspection system of claim 1, wherein the sample is at least one of a photomask, a reticle, or a semiconductor wafer.

3. The inspection system of claim 1, wherein the aperture at the center portion of each of the first multi-cell detectors is configured to let the illumination beam pass.

4. The inspection system of claim 1, wherein the program instructions further cause the one or more processors to:
   calibrate the first illumination intensity distribution signal to the illumination beam by mapping an offset from a center point in the first illumination intensity distribution signal to instability of the illumination beam.

5. The inspection system of claim 4, wherein the program instructions further cause the one or more processors to:
   stabilize the illumination beam based on the first illumination intensity distribution signal by applying a corrective action to at least one of (i) the illumination source or (ii) optical components in a path of the illumination beam.

6. The inspection system of claim 5, wherein:
   a first illumination path of a first part of the illumination beam includes the first multi-cell detectors, the second multi-cell detectors, and the detector assembly, and
   a second illumination path of a second part of the illumination beam includes a side detector configured to generate a third illumination intensity distribution signal when the second part of the illumination beam impinges thereon.

7. The inspection system of claim 6, wherein the program instructions further cause the one or more processors to:
   calibrate the third illumination intensity distribution signal to the images by mapping distortions in the third illumination intensity distribution signal to the distorted pixels in the images,
   adjust the intensities of the distorted pixels in the images based on the third illumination intensity distribution signal and the second illumination intensity distribution signal to generate the corrected images, and
   detect the defects on the sample using the corrected images.

8. The inspection system of claim 7, wherein the side detector is at least one of a:
   charge coupled device (CCD), a complementary metal-oxide-semiconductor (CMOS) sensor, an active pixel sensor (APS), or a time-delay integration (TDI) sensor.

9. The inspection system of claim 1, wherein:
   a first illumination path of a first part of the illumination beam includes the first multi-cell detectors, the second multi-cell detectors, and the detector assembly, and
   a second illumination path of a second part of the illumination beam includes a side detector configured to generate a third illumination intensity distribution signal when the second part of the illumination beam impinges thereon.

10. The inspection system of claim 9, wherein the program instructions further cause the one or more processors to:
    calibrate the third illumination intensity distribution signal to the images by mapping distortions in the third illumination intensity distribution signal to the distorted pixels in the images,
    adjust the intensities of the distorted pixels in the images based on the third illumination intensity distribution signal and the second illumination intensity distribution signal to generate the corrected images, and
    detect the defects on the sample using the corrected images.

11. The inspection system of claim 1, wherein the two or more segments of the first multi-cell detectors comprise at least one of four segments, six segments, or eight segments, and the two or more segments of the second multi-cell detectors comprise at least one of four segments, six segments, or eight segments.

12. An inspection method, comprising:
    emitting an extreme ultraviolet (EUV) illumination beam using an illumination source;
    generating a first photocurrent with one or more first multi-cell detectors when the illumination beam passes through each of the first multi-cell detectors, wherein each of the first multi-cell detectors comprises at least two segments and an aperture at a center portion thereof;

generating a first illumination intensity distribution signal based on the first photocurrent;
generating a second photocurrent with one or more second multi-cell detectors when the illumination beam passes through each of the second multi-cell detectors, wherein each of the second multi-cell detectors comprises at least two segments;
generating a second illumination intensity distribution signal based on the second photocurrent;
illuminating a sample with the illumination beam;
receiving the illumination beam from the sample with a detector assembly;
generating images based on the illumination beam;
calibrating the second illumination intensity distribution signal generated by the second multi-cell detectors to the images generated by the detector assembly by mapping distortions in the second illumination intensity distribution signal to distorted pixels in the images;
adjusting intensities of the distorted pixels in the images based on the second illumination intensity distribution signal to generate corrected images; and
detecting defects on the sample using the corrected images.

13. The inspection method of claim 12, wherein the sample is at least one of a photomask, a reticle, or a semiconductor wafer.

14. The inspection method of claim 12, wherein the aperture at the center portion of each of the first multi-cell detectors is configured to let the illumination beam pass.

15. The inspection method of claim 12, further comprising:
calibrating the first illumination intensity distribution signal to the illumination beam by mapping an offset from a center point in the first illumination intensity distribution signal to instability of the illumination beam.

16. The inspection method of claim 15, further comprising:
stabilizing the illumination beam based on the first illumination distribution signal by applying a corrective action to at least one of (i) the illumination source or (ii) optical components in a path of the illumination beam.

17. The inspection method of claim 16, wherein:
a first illumination path of a first part of the illumination beam includes the first multi-cell detectors, the second multi-cell detectors, and the detector assembly, and
a second illumination path of a second part of the illumination beam includes a side detector configured to generate a third illumination intensity distribution signal when the second part of the illumination beam impinges thereon.

18. The inspection method of claim 17, further comprising:
calibrating the third illumination intensity distribution signal to the images by mapping distortions in the third illumination intensity distribution signal to the distorted pixels in the images,
adjusting the intensities of the distorted pixels in the images based on the third illumination intensity distribution signal and the second illumination intensity distribution signal to generate the corrected images, and
detecting the defects on the sample using the corrected images.

19. The inspection method of claim 18, wherein the side detector is at least one of a:
charge coupled device (CCD), a complementary metal-oxide-semiconductor (CMOS) sensor, an active pixel sensor (APS), or a time-delay integration (TDI) sensor.

20. The inspection method of claim 12, wherein:
a first illumination path of a first part of the illumination beam includes the first multi-cell detectors, the second multi-cell detectors, and the detector assembly, and
a second illumination path of a second part of the illumination beam includes a side detector configured to generate a third illumination intensity distribution signal when the second part of the illumination beam impinges thereon.

21. The inspection method of claim 20, further comprising:
calibrating the third illumination intensity distribution signal to the images by mapping distortions in the third illumination intensity distribution signal to the distorted pixels in the images,
adjusting the intensities of the distorted pixels in the images based on the third illumination intensity distribution signal and the second illumination intensity distribution signal to generate the corrected images, and
detecting the defects on the sample using the corrected images.

22. The inspection method of claim 12, wherein the two or more segments of the first multi-cell detectors comprise at least one of four segments, six segments, or eight segments, and the two or more segments of the second multi-cell detectors comprise four segments, six segments, or eight segments.

* * * * *